United States Patent
Suchy et al.

(10) Patent No.: US 8,580,331 B2
(45) Date of Patent: Nov. 12, 2013

(54) DIGITAL MANUFACTURE OF AN ELECTRICAL CIRCUIT

(75) Inventors: Donna P. Suchy, Rochester, NY (US); Diane M. Herrick, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 951 days.

(21) Appl. No.: 12/570,009

(22) Filed: Sep. 30, 2009

(65) Prior Publication Data

US 2011/0073356 A1 Mar. 31, 2011

(51) Int. Cl.
*B05D 5/12* (2006.01)
*G03G 15/16* (2006.01)

(52) U.S. Cl.
USPC ........... 427/58; 427/96.1; 427/97.3; 428/901; 399/223

(58) Field of Classification Search
USPC ............ 427/96.1, 97.1, 97.3, 97.4, 458, 461, 427/466–468, 56, 205, 190, 191, 192; 428/901
See application file for complete search history.

(56) References Cited

U.S. PATENT DOCUMENTS

| | | | |
|---|---|---|---|
| 4,965,131 A | 10/1990 | Nair et al. | |
| 5,778,295 A | 7/1998 | Chen et al. | |
| 6,567,641 B1 | 5/2003 | Aslam et al. | |
| 7,232,499 B2 | 6/2007 | Kerr et al. | |
| 7,274,289 B2 | 9/2007 | Kerr et al. | |
| 2006/0273305 A1 | 12/2006 | Grinwald et al. | |
| 2008/0305425 A1 | 12/2008 | Kamada et al. | |
| 2009/0142100 A1* | 6/2009 | Suchy et al. | 399/223 |

FOREIGN PATENT DOCUMENTS

NL 8 801 450 A 1/1990

* cited by examiner

*Primary Examiner* — Dah-Wei Yuan
*Assistant Examiner* — Jose Hernandez-Diaz
(74) *Attorney, Agent, or Firm* — Donna P. Suchy (57) ABSTRACT

Electrographic printing of one or more multi-channeled layers produces a specialty item. Such electrographic printing includes forming a desired print image, electrographically, on a receiver member utilizing predetermined sized marking particles; and, where desired, forming one or more final multi-channeled layers utilizing marking particles of a predetermined size or size distribution.

7 Claims, 8 Drawing Sheets

FIG. 9

DIGITAL MANUFACTURE OF AN ELECTRICAL CIRCUIT

CROSS REFERENCE TO RELATED APPLICATIONS

This application relates to commonly assigned, copending U.S. application Ser. No. 12/569,997, filed Sep. 30, 2009, published as US2011/0076059, entitled: "DIGITAL MANUFACTURE OF A MULTI-CHANNELED SPECIALITY ITEM."

FIELD OF THE INVENTION

The present invention relates electrographic printing and more particularly to printing an electrical circuit electrographically.

BACKGROUND OF THE INVENTION

A printed circuit board is used to mechanically support and electrically connect electronic components using conductive pathways, or traces, etched from copper sheets laminated onto a non-conductive substrate. They may also be referred to as printed wiring board or etched wiring board. A printed circuit populated with electronic components is a printed circuit assembly, also known as a printed circuit board assembly.

Printed circuits are rugged, inexpensive, and can be highly reliable. They require much more layout effort and higher initial cost than either wire-wrapped or point-to-point constructed circuits, but are much cheaper and faster for high-volume production. Conducting layers are typically made of thin copper foil. Insulating layers are typically laminated together with epoxy resin. The board is typically green in color and made of materials like polytetrafluoroethylene, FR-4, FR-1, CEM-1 or CEM-3. Well known prepreg materials used in the PCB industry are FR-2 (Phenolic cotton paper), FR-3 (Cotton paper and epoxy), FR-4 (Woven glass and epoxy), FR-5 (Woven glass and epoxy), FR-6 (Matte glass and polyester), G-10 (Woven glass and epoxy), CEM-1 (Cotton paper and epoxy), CEM-2 (Cotton paper and epoxy), CEM-3 (Woven glass and epoxy), CEM-4 (Woven glass and epoxy), CEM-5 (Woven glass and polyester).

Most printed circuit boards are made by bonding a layer of copper over the entire substrate, sometimes on both sides, (creating a "blank PCB") then removing unwanted copper after applying a temporary mask (e.g. by etching), leaving only the desired copper traces. A few PCBs are made by adding traces to the bare substrate (or a substrate with a very thin layer of copper) usually by a complex process of multiple electroplating steps.

There are three common "subtractive" methods (methods that remove copper) used for the production of printed circuit boards: Silk screen printing uses etch-resistant inks to protect the copper foil. Subsequent etching removes the unwanted copper. Alternatively, the ink may be conductive, printed on a blank (non-conductive) board. The latter technique is also used in the manufacture of hybrid circuits.

Photoengraving uses a photomask and chemical etching to remove the copper foil from the substrate. The photomask is usually prepared with a photoplotter from data produced by a technician using CAM, or computer-aided manufacturing software. Laser-printed transparencies are typically employed for phototools; however, direct laser imaging techniques are being employed to replace phototools for high-resolution requirements.

PCB milling uses a two or three-axis mechanical milling system to mill away the copper foil from the substrate. A PCB milling machine (referred to as a 'PCB Prototype') operates in a similar way to a plotter, receiving commands from the host software that control the position of the milling head in the x, y, and (if relevant) z axis. Data to drive the Prototyper is extracted from files generated in PCB design software and stored in HPGL or Gerber file format.

"Additive" processes also exist. The most common is the "semi-additive" process. In this version, the unpatterned board has a thin layer of copper already on it. A reverse mask is then applied. (Unlike a subtractive process mask, this mask exposes those parts of the substrate that will eventually become the traces.) Additional copper is then plated onto the board in the unmasked areas; copper may be plated to any desired weight. Tin-lead or other surface platings are then applied. The mask is stripped away and a brief etching step removes the now-exposed original copper laminate from the board, isolating the individual traces.

The additive process is commonly used for multi-layer boards as it facilitates the plating-through of the holes (to produce conductive bias) in the circuit board.

One method for printing images on a receiver member is referred to as electrography. In this method, an electrostatic image is formed on a dielectric member by uniformly charging the dielectric member and then discharging selected areas of the uniform charge to yield an image-wise electrostatic charge pattern. Such discharge is typically accomplished by exposing the uniformly charged dielectric member to actinic radiation provided by selectively activating particular light sources in an LED array or a laser device directed at the dielectric member. After the image-wise charge pattern is formed, the pigmented (or in some instances, non-pigmented) marking particles are given a charge, substantially opposite the charge pattern on the dielectric member and brought into the vicinity of the dielectric member so as to be attracted to the image-wise charge pattern to develop such pattern into a visible image.

Thereafter, a suitable receiver member (e.g., a cut sheet of plain bond paper) is brought into juxtaposition with the marking particle developed image-wise charge pattern on the dielectric member. A suitable electric field is applied to transfer the marking particles to the receiver member in the image-wise pattern to form the desired print image on the receiver member. The receiver member is then removed from its operative association with the dielectric member and the marking particle print image is permanently fixed to the receiver member typically using heat, and/or pressure and heat. Multiple layers or marking materials can be overlaid on one receiver, for example, layers of different color particles can be overlaid on one receiver member to form a multi-color print image on the receiver member after fixing.

Metal films, such as aluminum and gold, are commonly used in the manufacture of metal coated printed articles and electrical circuits in the commercial printing business. Currently there are commercial devices that stamp metal films, including a wide variety of reflective and electrically conductive thin films on various substrates.

There is a critical need in the art for a technique to create patterned conductive structures in a cost effective manner for short runs or with variable information. In addition to providing superior electrode performance, these conductive layers also must be digitally patterned, must resist the effects of humidity change, and be manufacturable at a reasonable cost.

It is toward the objective of providing both such improved electrically conductive, digitally patterned articles that more effectively meet the diverse commercial needs than those of the prior art, that the present invention is directed.

The printed circuits of the present invention are patterned by application of one or more toners using the electrographic development process. The final pattern is "fixed" by means of pressure and (or) heat fixing step, whereupon the toner particles interacts with a conductive powder to adhere the conductive powder to a substrate.

There is a need for digitally prepared electrical circuits that are inexpensive. This invention solves this problem by creating digitally printed channels that can be used to create the circuits.

SUMMARY OF THE INVENTION

In view of the above, this invention is directed to electrographic printing wherein toner and/or laminates form one or more multi-channeled layers, with a particular pattern, which can be printed by electrographic techniques and then filled or adapted as needed. Such electrographic printing includes the steps of forming a desired image, electrographically, on a receiver member and incorporating channels that are embedded into the design.

The multi layered channel printing apparatus and related method and print incorporates one or more static layers, and one or more layers that allow a variety of fluids to move into and/or through the micro channels via an opening or through a direct fill. These fluids can be solidified or left as a fluid. An optional capping layer or substrate may then also be applied as well as post printing treatments.

The printing method for producing a digital specialty item, such as upon a receiver, includes the steps of depositing a static layer of material, such as toner, to form a predetermined base layer, depositing one or more material nodes over the static layer, the material nodes in a first state and depositing a top layer of material over the nodes, the top layer defining an expansion space between the static layer and the top layer so that during activation the one or more nodes can change in the expansion space to create a predetermined digitally prepared specialty item.

The invention, and its objects and advantages, will become more apparent in the detailed description presented below.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures.

In the detailed description of the preferred embodiment of the invention presented below, reference is made to the accompanying drawings, in which.

DETAILED DESCRIPTION OF THE INVENTION

Figure 1:
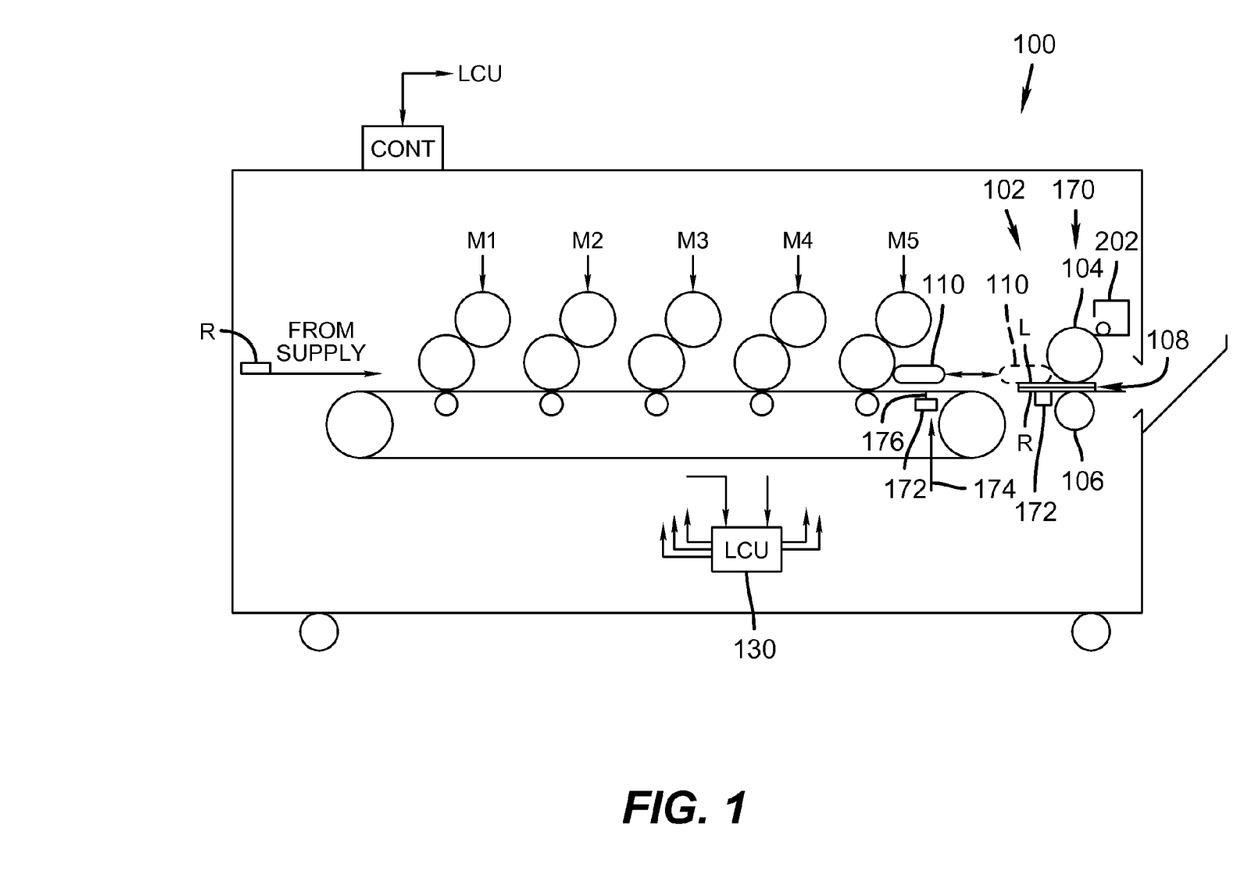
FIG. 1 is a schematic side elevational view, in cross section, of a typical electrographic reproduction apparatus suitable for use with this invention.
Figure 2:
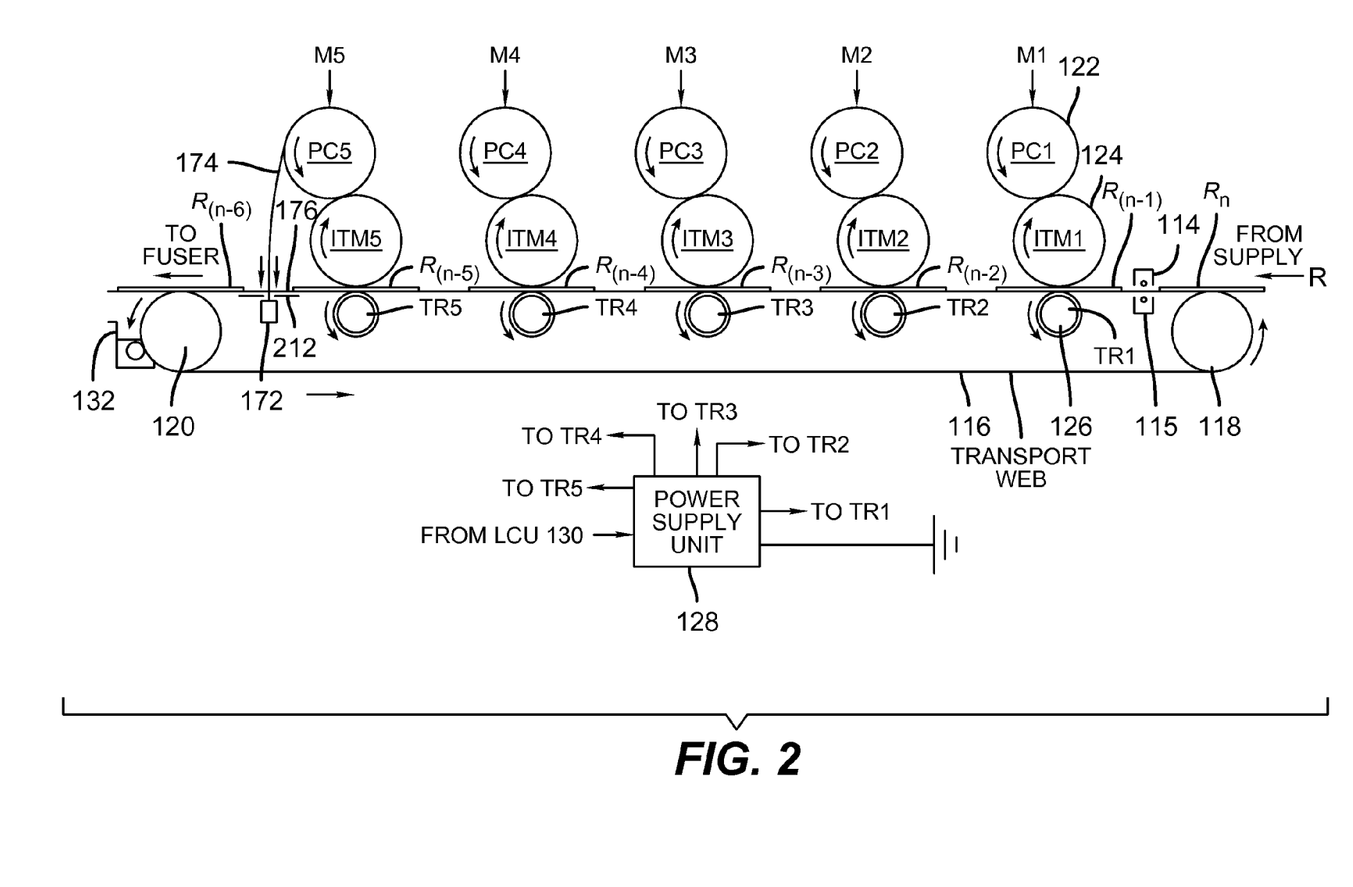
FIG. 2 is a schematic side elevational view, in cross section, of the reprographic image-producing portion of the electrographic reproduction apparatus of FIG. 1, on an enlarged scale.

Referring now to the accompanying drawings, FIGS. 1 and 2 are side elevational views schematically showing portions of a typical electrographic print engine or printer apparatus suitable for printing of multi-channel layered prints. One embodiment of the invention involves printing using an electrophotographic engine having five sets of single layer image producing or printing stations or modules arranged in tandem and an optional finishing assembly. The invention contemplates that more or less than five stations may be combined to deposit a material, such as toner, on a single receiver member, or may include other typical electrographic writers, printer apparatus, or other finishing devices.

In one embodiment, an electrographic printer apparatus 100 has a number of tandemly arranged electrostatographic image forming printing modules M1, M2, M3, M4, and M5 and a finishing assembly 102. Additional modules may be provided.

Each of the printing modules generates a single-layer toner image for transfer to a receiver member successively moved through the modules. The finishing assembly has a fuser roller 104 and an opposing pressure roller 106 that form a fusing nip 108 there between. The finishing assembly 102 can also include a laminate application device 110. A receiver member R, during a single pass through the five modules, can have transferred, in registration, up to five single toner images to form a pentalayer image. As used herein, the term pentalayer implies that in an image formed on a receiver member combinations of subsets of the five layers are combined to form other layers on the receiver member at various locations on the receiver member, and that all five layers participate to form multiple layers in at least some of the subsets wherein each of the five layers may be combined with one or more of the other layers at a particular location on the receiver member to form a layer different than the specific layer toners combined at that location.

Receiver members (Rn-R(n−6), where n is the number of modules as shown in FIG. 2) are delivered from a paper supply unit (not shown) and transported through the printing modules M1-M5 in a direction indicated in FIG. 2 as R. The receiver members are adhered (e.g., preferably electrostatically via coupled corona tack-down chargers 114, 115) to an endless transport web 116 entrained and driven about rollers 118, 120. Each of the printing modules M1-M5 similarly includes a photoconductive imaging roller, an intermediate transfer member roller, and a transfer backup roller. Thus in printing module M1, a toner separation image can be created on the photoconductive imaging roller PC1 (122), transferred to intermediate transfer member roller ITM 1 (124), and transferred again to a receiver member moving through a transfer station, which includes ITM1 forming a pressure nip with a transfer backup roller TR1 (126).

Similarly, printing modules M2, M3, M4, and M5 include, respectively: PC2, ITM2, TR2; PC3, ITM3, TR3; PC4, ITM4, TR4; and PC5, ITM5, TR5. A receiver member, Rn, arriving from the supply, is shown passing over roller 118 for subsequent entry into the transfer station of the first printing module, Ml, in which the preceding receiver member R(n-i) is shown. Similarly, receiver members R(n-2), R(n-3), R(n-4), and R(n-5) are shown moving respectively through the transfer stations of printing modules M2, M3, M4, and M5. An unfused image formed on receiver member R (n-6) is moving, as shown, towards one or more finishing assemblies 102 including a fuser, such as those of well known construction, and/or other finishing assemblies in parallel or in series that includes, preferably a lamination device 110 (shown in FIG. 1). Alternatively the lamination device 110 can be included in conjunction to one of the print modules, Mn, which in one embodiment is the fifth module M5.

A power supply unit 128 provides individual transfer currents to the transfer backup rollers TR1, TR2, TR3, TR4, and TR5 respectively. A logic and control unit 130 (FIG. 1) in response to signals from various sensors associated with the electrophotographic printer apparatus 100 provides timing and control signals to the respective components to provide control of the various components and process control parameters of the apparatus in accordance with well understood and known employments. A cleaning station 132 for transport web 116 is also typically provided to allow continued reuse thereof.

If a circuit is to be created this is a preset pattern that is digitally changeable. The electrode pattern for 1 or more circuits are printed with toner using a standard electostatographic process known in the industry, preferably dry elec­trophotography, and then any leads or multi color additions are printed in series as shown in FIG. 2.

The toner used to form the final predetermined pattern is affected by the size distribution so a closely controlled size and pattern is desirable. This can be achieved through the grinding and treating of toner particles to produce various resultants sizes. This is difficult to do for the smaller particular sizes and tighter size distributions since there are a number of sizes produced that must be separated out. This results in either poor distributions and/or very expensive and poorly controlled processes. An alternative is to use a limited coalescence and/or evaporative limited coalescence techniques that can control the size through stabilizing particles, such as silicon. These particles are referred to as chemically prepared dry ink(CDI) below. Some of these limited coalescence techniques are described in patents pertaining to the preparation of electrostatic toner particles because such techniques typically result in the formation of toner particles having a substantially uniform size and uniform size distribution. Representative limited coalescence processes employed in toner preparation is described in U.S. Pat. No. 4,965,131, which is hereby incorporated by reference. In one example a pico high viscosity toner, of the type described above, could form the first and or second layers and the top layer could be a laminate or an 8 micron clear toner in the fifth station thus the highly viscous toner would not fuse at the same temperature as the other toner.

In the limited coalescence techniques described, the judicious selection of toner additives such as charge control agents and pigments permits control of the surface roughness of toner particles by taking advantage of the aqueous organic interphase present. It is important to take into account that any toner additive employed for this purpose that is highly surface active or hydrophilic in nature may also be present at the surface of the toner particles.

Particulate and environmental factors that are important to successful results include the toner particle charge/mass ratios (it should not be too low), surface roughness, poor thermal transfer, poor electrostatic transfer, reduced pigment coverage, and environmental effects such as temperature, humidity, chemicals, radiation, and the like that affects the toner or paper. Because of their effects on the size distribution they should be controlled and kept to a normal operating range to control environmental sensitivity.

This toner also has a tensile modulus (103 psi) of 350-1020, normally 345, a flexural modulus (103 psi) of 300-500, normally 340, a hardness of M70-M72 (Rockwell), a thermal expansion of 68-70 10 6/degree Celsius, a specific gravity of 1.2 and a slow, slight yellowing under exposure to light.

This toner also has a tensile modulus (103 psi) of 150-500, normally 345, a flexural modulus (103 psi) of 300-500, normally 340, a hardness of M70-M72 (Rockwell), a thermal expansion of 68-70 10 6/degree Celsius, a specific gravity of 1.2 and a slow, slight yellowing under exposure to light according to J. H. DuBois and F. W. John, eds., in Plastics, 5th edition, Van Norstrand and Reinhold, 1974 (page 522). Various attributes make the use of this toner a good toner to use.

The described toner normally has a melting range that can be between 50-300 degrees Celsius. Surface tension, roughness and viscosity should be such as to yield a better transfer. Surface profiles and roughness can be measured using the Federal 5000 "Surf Analyzer" and is measured in regular units, such as microns. Toner particle size, as discussed above is also important since larger particles not only result in the desired heights and patterns but also results in a clearer multi-channeled layers since there is less air inclusions, normally, in a larger particle. Toner viscosity is measured by a Mooney viscometer, a meter that measures viscosity, and the higher viscosities will keep a multi-channeled layer's pattern better and can result in greater height. The higher viscosity toner will also result in a retained form over a longer period of time.

Melting point is often not as important of a measure as the glass transition temperature (Tg), discussed above. This range is around 50-100 degrees Celsius, often around 118 degrees Celsius. Clarity, or low haze, is important for multi-channeled layers that are transmissive or reflective wherein clarity is an indicator and haze is a measure of higher percent of transmitted light.

In one mode of practicing this invention, an electrostatic latent image in the pattern of the printed circuit is produced on a primary imaging member comprising a photoreceptor. The electrostatic latent image is then developed into a visible image using a specially prepared conductive powder, described forthwith. The image was then electrostatically transferred, using conventional electrostatic roller transfer, known in the electrophotography art, to a paper receiver. The image was then permanently fixed by exposing the image to either solvent vapors emanating from a sump containing dichloromethane or by heating the image bearing receiver to a temperature sufficient to fuse the powder to the receiver. If desired, conductivity can be enhanced by forcing the conductive powder particles into even closer proximity to each other by casting the fixed image-bearing receiver against a smooth material such as a polyimide sheet such as Kaptan-H (manufactured by DuPont), using heated rollers in a process known in the art as ferrotyping.

This invention works well with an electrographic printer because, unlike many circuits to be printed with electrographic printers, conductive or non conductive particles are suitable for use in the aforementioned application. If these particles are to be charged then the non-conductive particles are used and electrically charged because they are transferred from the primary image bearing member to the receiver in a one pass printing method. If conductive particles are to be used, the particles are used as filler and this can be done with a conductive particle in a two-part process. The final circuit must create an item that is highly conductive to be suitable for use in forming printed circuits.

If a one step process is to be used, this is done by coating the conductive particles with a thermoplastic, electrically insulating polymer with a coating that is sufficient to prevent or at least substantially reduce discharging, but not so great as to prevent contact between the conductive particles in the fused image. This can be accomplished by blending an amount of conducting powder with an amount of polymer in a ratio by weight of between 0.7 and 3.0 times the ratio of the mass densities of the polymer and material comprising the conducting powder. Suitable conducting powders include silver, gold, stainless steel, copper, carbon, and aluminum. Suitable polymers include thermoplastics, preferably with a glass transition temperature between 50° C. and 70° C. Suitable materials include polyester, polystyrene, polyester amides, polycarbonates, etc.

As an example, the conducting powder used in this study was prepared by first dissolving 4 g of polyester granules (mass density=1.2 g/cm$^3$) in 60 ml of dichloromethane. After dissolving the polyester, 60 g of silver powder (sold by DuPont (mass density=10.5 g/cm$^3$) was added, for a conducting powder to polymer ratio of 15. The ratio of the density of the silver to polyester was 8.75, resulting in a blend of materials within the aforementioned limits. The dispersion was then allowed to thoroughly dry, after which the materials was ground into a fine powder in a mortar and pestle. Other means of preparing suitable materials include compounding and grinding, and chemical means such as evaporative limited coalescence, as well as other means known in the literature. It should be noted that the concentration of the conducting powder to powder is much higher for this application than for normal electrophotographic printing applications and would not be suitable for such printing applications. Conversely, the carbon concentration in black pigment, for example, is much too low to be suitable for the present application.

It should be noted that the size of the composite particles comprising the polymer and conductive powder, hereafter referred to as "toner" is not critical. However, there are several constraints that need to be taken into account when preparing the toner. Toner particles preferably should be greater than approximately 2 μm if dry electrophotographic printing is used to make the image. However, smaller particles can be used if wet electrophotographic development, whereby the toner is dispersed in a carrier fluid such as Isopar-G. Maximum size of the toner is restricted by the fineness of the wires to be produced. For example, if it is desired to produce 1 mil wires (i.e. 25 μm) the toner particles should preferably be less than 8 μm in diameter to ensure that there are sufficient particles to ensure good interparticle contact. To avoid formation of satellites that can bridge wires, it is generally undesirable to have toner particles having diameters greater than approximately 20 μm.

In any contact fusing the speed of fusing and resident times and related pressures applied are also important to achieve the particular final desired multi-channeled layers. Contact fusing may be necessary if faster turnarounds are needed. Various finishing methods would include both contact and non-contact including heat, pressure and chemical as well as IR and UV.

Figure 3:
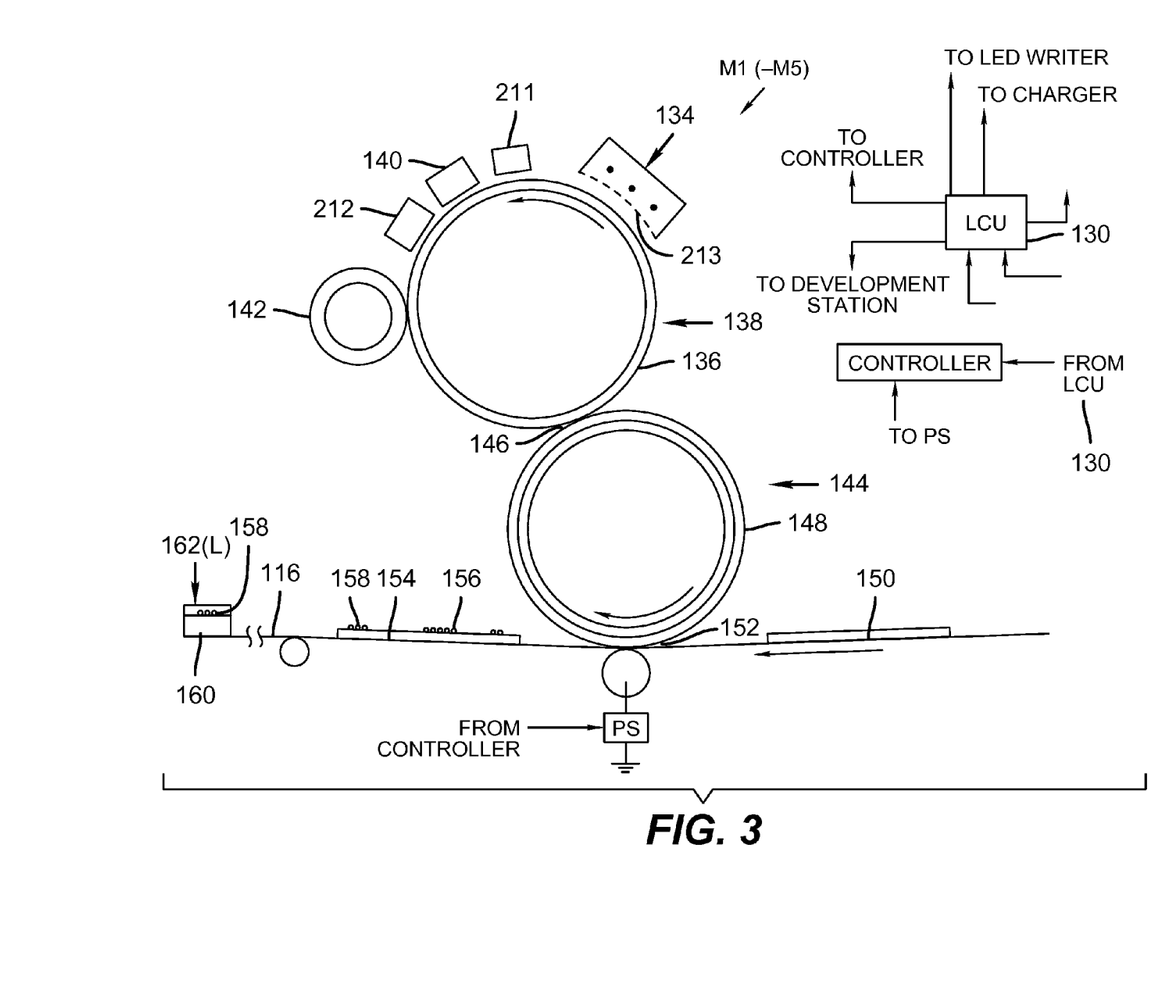
FIG. 3 is a schematic side elevational view, in cross section, of one printing module of the electrographic reproduction apparatus of FIG. 1, on an enlarged scale.

With reference to FIG. 3 wherein a representative printing module (e.g., M1 of M1-M5) is shown, each printing module of the electrographic printer apparatus 100 includes a plurality of electrographic imaging subsystems for producing one or more multilayered image or pattern. Included in each printing module is a primary charging subsystem 134 for uniformly electrostatically charging a surface 136 of a photoconductive imaging member (shown in the form of an imaging cylinder 138). An exposure subsystem 140 is provided for image-wise modulating the uniform electrostatic charge by exposing the photoconductive imaging member to form a latent electrostatic multi-layer (separation) image of the respective layers. A development station subsystem 142 serves for developing the image-wise exposed photoconductive imaging member. An intermediate transfer member 144 is provided for transferring the respective layer (separation) image from the photoconductive imaging member through a transfer nip 146 to the surface 148 of the intermediate transfer member 144 and from the intermediate transfer member 144 to a receiver member (receiver member 150 shown prior to entry into the transfer nip 152 and receiver member 154 shown subsequent to transfer of the multilayer (separation) image) which receives the respective (separation) images 156 in superposition to form a composite image 158 thereon.

Receiver member 160 shown subsequent to the transfer of an additional layer 162 that can be, in one embodiment, a laminate L.

The logic and control unit (LCU) 130 shown in FIG. 3 includes a microprocessor incorporating suitable look-up tables and control software, which is executable by the LCU 130. The control software is preferably stored in memory associated with the LCU 130. Sensors associated with the fusing assembly provide appropriate signals to the LCU 130. In response to sensors S, the LCU 130 issues command and control signals that adjust the heat and/or pressure within fusing nip 108 and otherwise generally nominalizes and/or optimizes the operating parameters of finishing assembly 102 (see FIG. 1) for printing multi- channeled layers in an image 158 on a substrate for a print.

Subsequent to transfer of the respective (separation) multilayered images, overlaid in registration, one from each of the respective printing modules MI-M5, the receiver member is advanced to a finishing assembly 102 (shown in FIG. 1) including one or more fusers 170 to optionally fuse the multilayer toner image to the receiver member resulting in a receiver product, also referred to as a final multi-channeled layer print. The finishing assembly 102 may include a sensor 172, an energy source 174 and one or more laminators 110. This can be used in conjunction to a registration reference 176 as well as other references that are used during deposition of each layer of toner, which is laid down relative to one or more registration references, such as a registration pattern.

The laminator 110 may be placed such that the laminate 162 is laid down prior to fusing or after the initial fusing. In one embodiment the apparatus of the invention uses a clear, without any pigment, laminate in one or more layers. The clear laminate, in one embodiment, can have a thickness that is greater then the largest material particle, such as a toner. The idea here is 3-D channels (bottom and sides) can be created either via larger toner particle build up as a feature, or via stamping (with features) on thermal remeldable surface, such as coated surfaces. Alternately, as discussed above the surface texture can be applied early in the printing process. An example is stamping which is essentially a 2-D process. In all the processes it is necessary to close off the channels. Any process that allows the top layer to follow the features below will collapse the channels created and will not work. One workable means is to apply a laminate without too much pressure/heat applied in the finishing steps to created channels in the 10 s micron range as described below.

It is necessary for the laminate, or an adhesive film used as a laminate, to have the structural integrity and thickness, as discussed above, to go onto electro photographic created channels without filling the channel when there are finishing actions, such as fusing, which is a remelting of the toner around the channels or the use of fusing oil on top. The laminate must work well in such an environment. One such laminate film is useful for this invention in an electro photographic digital printer and the laminate also has oil absorption capability, so the lamination can be applied uniformly to electro photographic printed images. One such laminate material is a laminate, such as Laminate GBC Layflat with a thickness of 37 urn (micron) is useful for this application since the thickness is on the order of magnitude of the desired channel width of 10-50 um that are large enough to allow the particle, such as toner, of less then 8 um to flow. By controlling the laminate thickness the channel is not occluded by distended laminate in that would block the channel.

Figure 4:
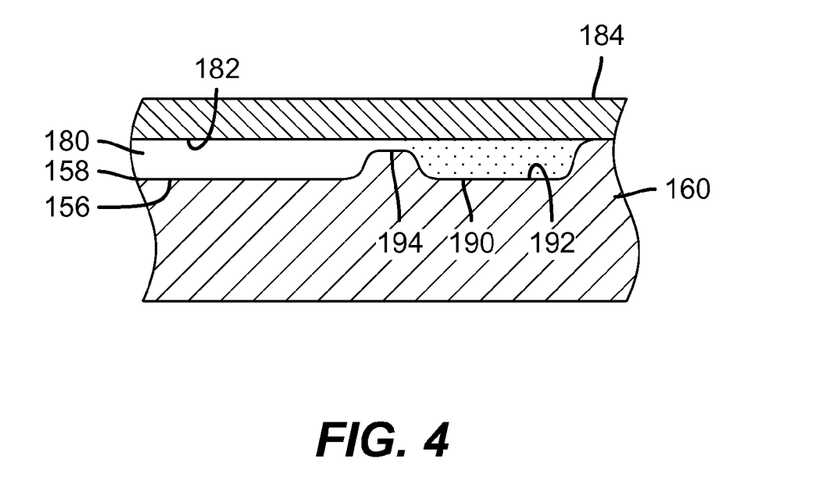
FIG. 4 is a schematic side elevational view, in cross section, of a print, produced by the invention.
Figure 5:
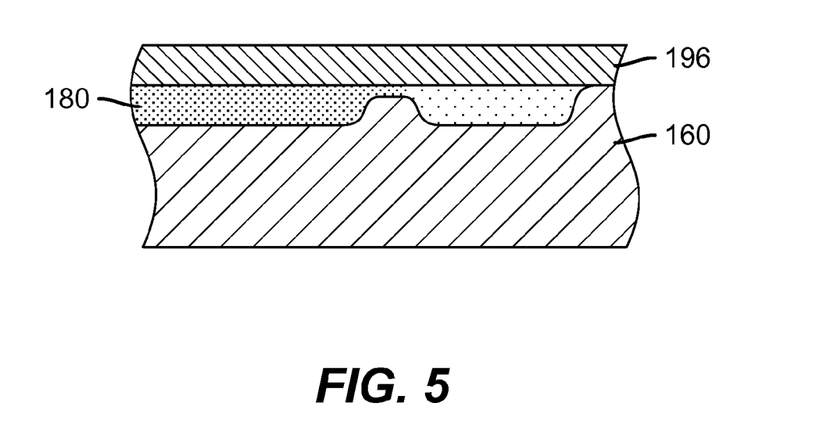
FIG. 5 is a schematic side elevational view, in cross section, of an activated print, having the predetermined multidimensional pattern formed in layers sufficient to form the final predetermined multi-channeled layers produced by the invention.

A multiple-channeled layer 180 includes one or more placed channels 182 of variable width but consistent thickness formed on the receiver 160, as shown in FIG. 4. There may be layers of toner laid down between the receiver 160 and the multiple-channeled layer 180. The multiple-channeled layers 180, including the channels 182, are formed prior to the application of a laminate 184. The channel may also include a node 190 that is filled with a material 192, such as a fluid or pigment, as well as a narrowed section 194 formed as part of the channel 182. The multiple-channeled layer 180 is capped in one of a few ways including the application of the laminate 184 as described below or laid down as a top layer 196 as shown in FIG. 5, in one or more layers on top of the multiple-channeled layer 180.

One or more other layers that allow a fluid to move through the micro channels via an opening and possibly including membranes and/or a micro pumps, such as in dielectrophoresis, to create fluid movement for small quantities of liquids that when overlapping a static layer can create a variable color or other physical characteristics such as variable materials having different viscosities. For example this method can be used to create many specialty items, such as items for packaging, pharmaceuticals, and electronics by various types of material, the size of the voids created and the particle used, which for electrographic printing is in the range of 10-100 microns which works for the following areas of specialty items. This can be aided by the use of micro pumps and/or electrophoresis.

Figure 6:
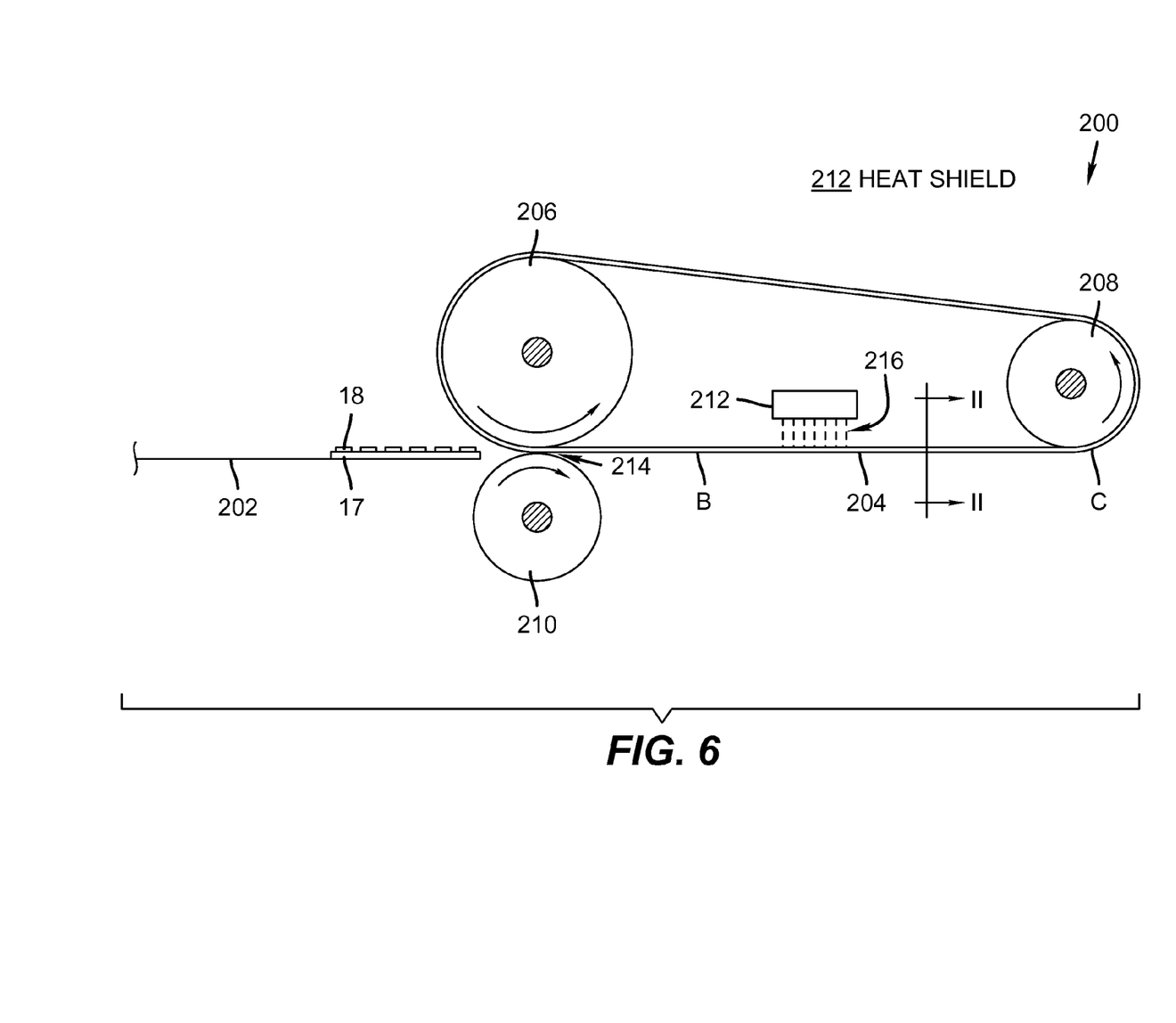
FIG. 6 is a schematic of a portion of the invention of FIG. 1.

One embodiment of the finishing assembly 102 that would allow the top layer to be applied during the fifth module is a type of finishing device 200 shown in FIG. 6. The multiple-channeled layer 180, along with one or more image layers, is transported along a path 202 to the finishing device. The finishing device includes a finishing or fusing belt 204, an optional heated glossing roller 206, a steering roller 208, and a pressure roller 210, as well as a heat shield 212. The fusing belt 204 is entrained about glossing roller 206 and steering roller 208.

The previously disclosed LCU 130 includes a microprocessor and suitable tables and control software which is executable by the LCU 130. The control software is preferably stored in memory associated with the LCU 130. Sensors associated with the fusing and glossing assemblies provide appropriate signals to the LCU 130 when the finishing device or laminator is integrated with the printing apparatus. In any event, the finishing device or laminator can have separate controls providing control over temperature of the glossing roller and the downstream cooling of the fusing belt and control of glossing nip pressure. In response to the sensors, the LCU 130 issues command and control signals that adjust the heat and/or pressure within fusing nip 108 so as to reduce image artifacts which are attributable to and/or are the result of release fluid disposed upon and/or impregnating a receiver member that is subsequently processed by/through finishing device or laminator 200, and otherwise generally nominalizes and/or optimizes the operating parameters of the finishing assembly 102 for receiver members that are not subsequently processed by/through the finishing device or laminator 200.

In one embodiment Step 1 of the method, using an electrographic printer creates a first layer as described above that creates channels. The printed substrate is preferably an insulating and thermally stable material such as polymide but other materials such as PET, fiberglass, and paper are also envisioned. The substrate may contain holes so that the electrical connections to the rear of the substrate could be made.

In Step 2 the electrode pattern printed with toner having either conducting particles or a powder to create a second conducting layer. Metallic particles such as copper, tin, tin plated copper, or silver particles are preferred, however conducting polymer particles are also envisioned. The conducting particles may have coatings on them to improve conduction between particles as described above or be two or more materials that create a metal when allowed to react or be fused. A conductive polymer coating on a metallic particle would facilitate the formation of conductive paths between particles in a subsequent fixing step. Conducting polymers may comprise metal salts or carbon to enhance conduction.

In Step 3 an adhering system applies heat to fix the conductive particles only to areas where the toned image resides. A fuser in the EP printer or similar device can be used to apply this heat or optionally a UV or other non contact heating system can be used. The heated toner in this step melts and acts as an adhesive to cause the conductive particles to adhere only in areas where the toner resides. When the toner cools the conductive particles become securely attached to the substrate. Other adhering systems such as one or more rollers can be used to apply pressure which may also be used in addition to or instead of heat in this step. Another method of fixing the toner is a vapor application device or even a chemical initiator.

Step 4: the printed substrate may then be optionally printed with another toner pattern using a standard electrostatographic process so that an insulating layer is applied over the conductive electrodes in areas that will not be in contact to subsequently applied circuit elements. Means to adequately register the first toner image with the second toner image are used as known in the industry.

Step 5: The toner used in Step 1 and or optional Step 5 may be cross linkable. The toner in one or both of the layers may optionally be cross-linked by application of heat (thermal cross-linking) or UV light (UV cross-linking) through the backside of the transparent or semi-transparent printing substrate for toner printed in Step 1 and directly for the toner printed in optional Step 5.

Circuit elements, such as integrated circuits, resistors, and capacitors, are then adhered to the printed substrate so that the electrodes of the printed electrodes make electrical contact to the appropriate electrodes of the circuit elements using any method known in the industry. Additional steps known in the industry can be used if needed to cut the substrate and, if needed, apply the substrate to a rigid board.

The above methods may also be used for making a multi-layer printed circuit. Steps 1-5 above are used to create each pair of layers of the printed circuit board which may be rigid or flexible in its final state. The substrate is preferably polymide. The substrate may contain holes so that the connections to the rear of the substrate could be made. At least the second printed toner layer in step 5 is then cross-linked as described above so that it will not become tacky when a second conductive layer is applied.

The electrophotographic printer can also produce a multi-layer printed circuit (See FIG. 4) using the imaging member to place one or more patterned images upon a substrate, using the imaging member, and the development station for image-wise depositing thermoplastic particles onto the primary imaging member, transferring the thermoplastic particles to an electrically insulating substrate and, after fusing the thermoplastic particles, depositing conductive powder over the substrate before the fuser permanently fixes the first thermoplastic layer and later, after application of the conductive particles, permanently fixes the conductive powder on the thermoplastic pattern-imaged substrate to create the printed circuit. Then a layer is applied, for example a layer of conductive particles and optional additional layers of thermoplastic insulating material and conductive materials are also applied. These additional layers can be repeated as needed and each layer is set, such as by fusing before the next set of layers are applied. It is important to insulate the layers when they are to be electrically separate but it is also possible to not insulate if that would add to that particular circuit.

The development station can use the cleaner to remove the particles not adhered or a separate device can be used for removing conductive powder from portions of the substrate other than that coated with the thermoplastic pattern before the development station deposits electrically-insulating thermoplastic particles uniformly over the substrate and cross-links these thermoplastic particles to give a thermoset layer before repeating the above steps to achieve additional layers of printed circuits.

Circuit elements, such as integrated circuits, resistors, and capacitors are then adhered to the printed substrate so that the electrodes of the printed circuit make electrical contact to the appropriate electrodes of the circuit elements. Additional steps known in the industry are then used to cut the substrate and if needed apply to a rigid board.

In another embodiment the channels are filled with a specialty material that, when treated, is a conductive metal. The filling step can be done using the same printer to deposit the specialty material into the channels. The first and second layers can be simultaneously printed or printed separately and there can be a number of iterations to layer one circuit on another. The types of materials that can produce a conductive metal include metallic particle as well as two materials that after a treatment or reaction create electrochemically deposited metals in said channels. The one or more channels can contain separate materials that are these two or more materials and, being temporary, are sacrificed during or after treatment to allow the materials to combine and form altered materials that are conductive.

In the methods described above the printed substrate can be subsequently printed on the rear surface using the similar steps so that circuit elements can be mounted on both sides of the substrate. Connections between each side can be made by filling holes that are drilled into the substrate either before the substrate is printed or afterward with conducting material.

Figure 7:
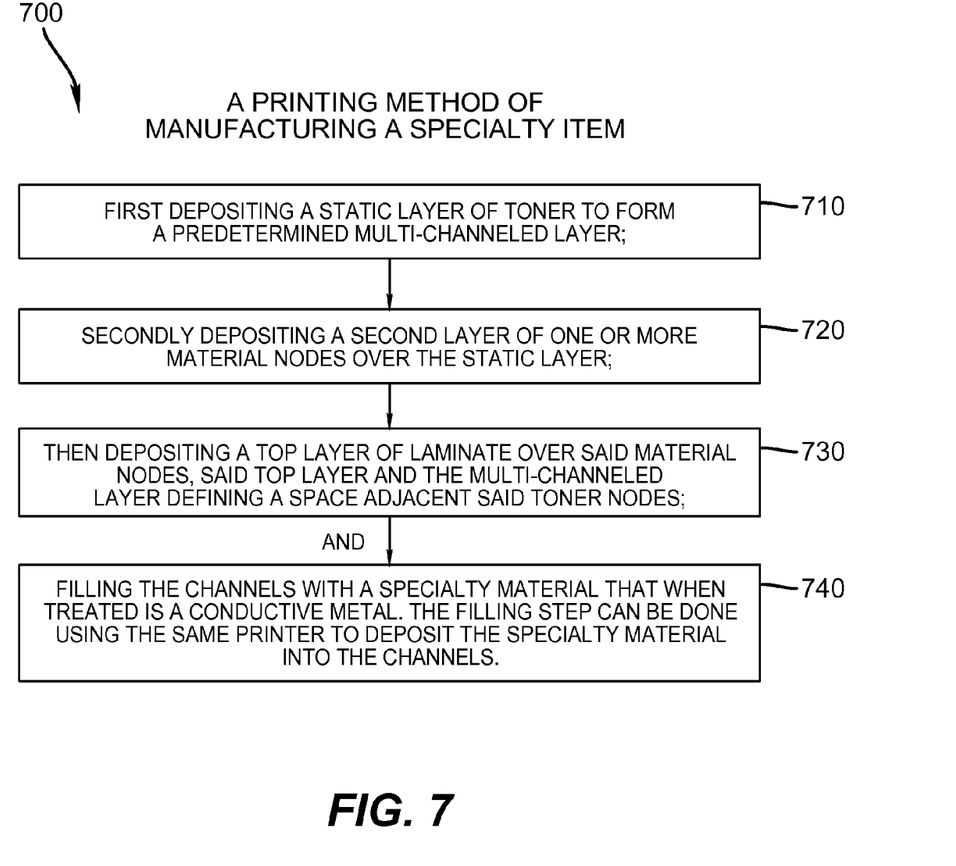
FIG. 7 is an embodiment of a method of printing suitable to manufacture digitally prepared specialty items.

FIG. 7 illustrates the flow chart of a method 700 for print methods for producing a specialty item structure. In the first step 710 a static layer of toner is deposited to form a predetermined base layer. In the second step 720, multiple layers of toner nodes are deposited over the static layer to form channels. In the third step 730, a laminate is applied and then the channels are filled with a material 740. The filling step can be done using the same printer to deposit the specialty material into the channels. Also lay the first and second layers can be simultaneously printed. The types of specialty materials include a hydroscopic material to absorb moisture can be located adjacent said specialty item, a hardenable liquid resin, non-visible trace materials and can include two or more materials that can combine.

Figure 8:
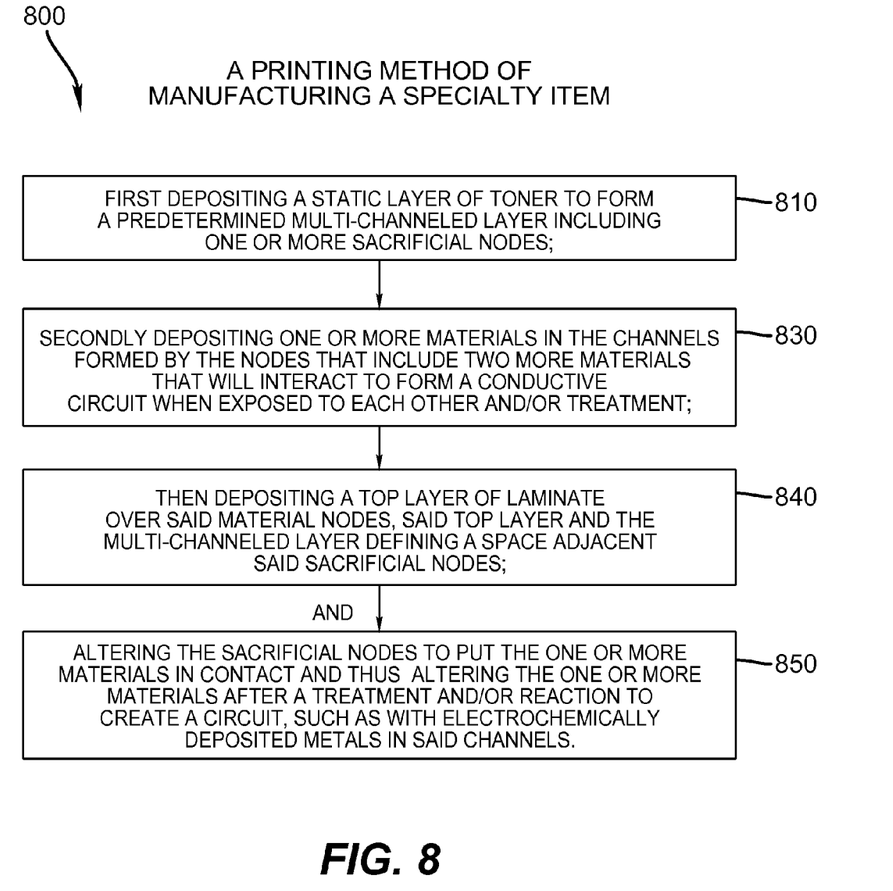
FIG. 8 is another embodiment of a method of printing suitable to manufacture digitally prepared specialty items.

FIG. 8 illustrates another embodiment of a method 800 for print methods for producing a specialty item structure that includes a circuit or is the circuit. Two materials are used to fill the channels and, if reactable, change when they are exposed to heat to create electrochemically deposited metals in said channels. If the one or more channels have temporary bathers one or more are able to be sacrificed during or after treatment. In another optional step, a top layer of toner or laminate is applied for protection or form maintaining a uniform light retaining interface.

In one embodiment illustrated in FIG. 8, a first layer of toner is deposited 810 to form a predetermined multi-channeled layer of Pattern P that includes one or more sacrificial nodes (820) (FIG. 9) and one or more materials (822, 824) are deposited (830) in the channels formed by the nodes such that the one or more materials will interact to form a conductive circuit when exposed to each other and/or treatment. The channels are filled with these one or more materials before or after depositing a top layer of laminate 840 over said material nodes and the top layer and the multi-channeled layer(s) define a space adjacent the sacrificial nodes. Then altering 850 the sacrificial nodes to put the one or more materials in contact and thus altering and/or activating the one or more materials after a treatment and/or reaction to create a circuit, such as with electrochemically deposited metals in said channels.

Activation can be obtained through a variety of methods and devices, any of which could move the node through one or more channels by creating a pressure differential across the node. The pressure differential can be created, in one embodiment, by a pressure or heat source so that when the source contacts the node the material in the node moves. This could be as simple as a person touching the surface of the printed receiver. Alternately a magnetic or electric energy source could be used.

The printed channels, that are essentially micro- voids , are filled to create these specialty items with a range of fluids. The filling can occur during printing or be an edge filling of voids adapted by leaving opening on the sides of the channels during printing if desired. In packaging some useful materials include hygroscopic materials to absorb moisture-embedded in the packaging and/or using a liquid resin that hardens to fill the channels. In packaging it is possible to create one or more large voids (e.g. pocket) by creating sacrificial nodes that are adaptable and can be destroyed at a future time by a chemical or physical post treatment. change. One example is simply pushing in the item, such as a disc, into the pocket and breaking the voids through the pressure the specialty item exerts against the temporal or sacrificial barriers or nodes. This is useful in the insertion of an instruction sheet inside a printed label (like how some medicine labels are). The described printing method can print these small "sacrificial" bridges/barriers" that break and allow a bigger "gap". This invention is also useful in packaging when a security cooler telltale is desired because the printer can use colored powdered dyes/pigments to fill the channels and thus create orientational "tell tale labels" in the printed item or packaging. Other useful materials to use in the channels are thermochromic (color changed by heat) powder and photochromic (density/color changed by light) powders that are discussed below.

In another embodiment the nodal barriers can be temporary to hold two materials apart until they are to be "combined" thus allowing the specialty item to produce a timely specialty item that, for example, its time sensitive. Such items include biological testing patches or arrays that could use a preamble laminate do the test subject would be in contact with the newly created combined material.

In all of these approaches, a clear toner may be applied on top of a receiver or a pattern, such as a color image, or a clear toner to form the final multi-channeled layers desired. It should be kept in mind that texture information corresponding to the clear toner image plane need not be binary. In other words, the quantity of clear toner called for, on a pixel by pixel basis, need not only assume either 100% coverage or 0% coverage; it may call for intermediate "gray level" quantities, as well.

These materials can be applied as a liquid or as a powder. If the material is applied as a powder then a post fusing will be necessary to remove scattering centers. A preferred embodiment is to apply the polymer as its monomer and polymerize in situ. The initiator for polymerization can be heat sensitive or photosensitive and it will be appreciated that the exact nature will depend on the application and polymer desired.

Capping of the specialty item device is desirable to avoid scratches and other damages which may degrade the usefulness of the specialty item. To accomplish this, the fluid can be capped before or after solidification. If capping is conducted before solidification, lamination is the preferred method as it is simpler to bridge the channels. In this case the lamination must be conducted carefully to prevent gas incorporation of air bubbles, which can act as scattering centers. The capping can also be conducted by depositing particles such as a toner by a process such as electrography or direct blade coating. In this case it would be desirable to have solidified the polymer in the channels such that mixing of the particles and the monomer can not occur. The particles are then fused by heat or solvent to create a uniform non-scattering layer. The capping can also be conducted by coating a liquid by methods well known in the art such as blade or hopper coating. After the coating the capping layer is solidified by drying, crosslinking, or polymerization.

It will be recognized that the capping layer is not necessary for specialty item function. Ai is a very low index material and will act to contain the specialty materials. There may be applications where no capping layer is necessary.

Figure 9:
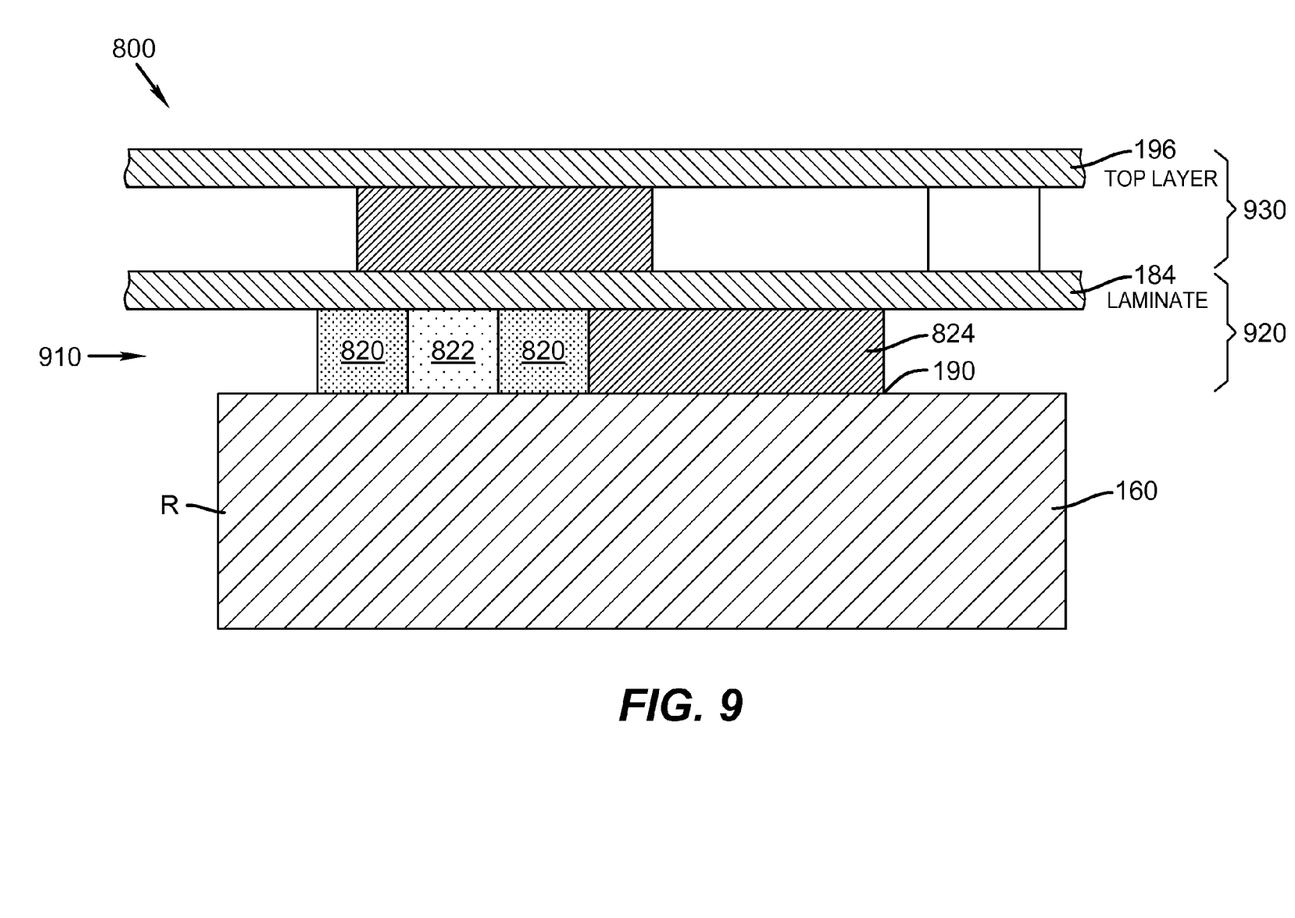
FIG. 9 is a schematic illustration of the print circuit prepared using the present invention produced by a modification of the method of FIG. 8.

One specialty item is shown in FIG. 9. FIG. 9 shows a side view of a final specialty item that has a circuit having a pattern P of the channels for containing the material as well as sacrificial nodes 820.

As described above this embodiment uses two or more materials (822, 824) separated by the nodes 820. The two materials (822, 824) react during or after treatment of the print such as during fusing. For example, electrochemistry is used to deposit new created materials, such as metals in the channels.

Referring to FIG. 9, the first fluid 822 and the second fluid 824 are placed together in the channel 190 and can react during or after treatment to make a first circuit 910 on a first layer 920 that is separated by a laminate 184 as described above. The second and subsequent layers can be created in a similar manner or by depositing metals that do not react. Alternatively the other layers, including the first layer, could contain other indicia or materials that are not metals. An optional top layer 196 can be placed on top to stabilize the item. This structure allows the first material in the first layer 920 and the second material in the first layer to move together into the channel formed after the sacrificial nodes are gone so that they can react when in contact and/or after treatment.

The invention has been described in detail with particular reference to certain preferred embodiments thereof, but it will be understood that variations and modifications can be effected within the spirit and scope of the invention. For example, the electron transporting layer can be a single inorganic layer or an inorganic layer with an underlying organic layer.

What is claimed is:

1. A printing method of manufacturing a specialty item comprising:
   a. depositing a first layer of toner to form a multi-channeled layer;
   b. depositing a second layer of toner over the first layer;
   c. depositing a top layer of laminate over said second layer, said top layer and the multi-channeled first layer defining a space there between;
   d. filling the channels with a specialty material; and
   e. treating the specialty material by applying heat and/or pressure to at least the specialty material to form a conductive metal.

2. The method of claim 1, further comprising laying down the first and second layer of toner simultaneously.

3. The method of claim 1, wherein said predetermined multi-channeled layer comprises an electrical circuit.

4. The method of claim 1, wherein the conductive metal comprises conductive powder.

5. The method of claim 1, said specialty material comprising two or more materials that can combine.

6. The method of claim 5 wherein said two materials are exposed to heat to create electrochemically deposited metals in said channels.

7. The method of claim 1, said one or more channels being temporary so that one or more are sacrificed during or after treatment.

* * * * *